(12) United States Patent
Hsieh

(10) Patent No.: US 7,786,528 B2
(45) Date of Patent: Aug. 31, 2010

(54) METAL SCHEMES OF TRENCH MOSFET FOR COPPER BONDING

(75) Inventor: Fu-Yuan Hsieh, Kaohsiung (TW)

(73) Assignee: Force MOS Technology Co., Ltd., Kaohsiung (TW)

( * ) Notice: Subject to any disclaimer, the term of this patent is extended or adjusted under 35 U.S.C. 154(b) by 0 days.

(21) Appl. No.: 12/318,988

(22) Filed: Jan. 14, 2009

(65) Prior Publication Data

US 2010/0176445 A1    Jul. 15, 2010

(51) Int. Cl.
*H01L 29/72* (2006.01)
(52) U.S. Cl. ............... 257/328; 257/330; 257/331; 257/341; 257/764; 257/786; 438/157; 438/209; 438/259; 438/268; 438/648

(58) Field of Classification Search ............. 257/328, 257/330, 331, 341, 764, 786; 438/157, 209, 438/259, 268, 648, 656
See application file for complete search history.

(56) References Cited

U.S. PATENT DOCUMENTS

| 6,888,196 B2* | 5/2005 | Kobayashi ............ 257/330 |
| 2008/0006951 A1* | 1/2008 | Hebert et al. ........... 257/786 |

* cited by examiner

*Primary Examiner*—Edward Wojciechowicz
(74) *Attorney, Agent, or Firm*—Bacon & Thomas, PLLC

(57) ABSTRACT

A trench MOSFET with improved metal schemes is disclosed. The improved contact structure applies a buffer layer to minimize the bonding damage to semiconductor when bonding copper wire upon front source and gate metal without additional cost.

13 Claims, 14 Drawing Sheets

US 7,786,528 B2

METAL SCHEMES OF TRENCH MOSFET FOR COPPER BONDING

BACKGROUND OF THE INVENTION

1. Field of the Invention

This invention relates generally to the cell structure and fabrication process of power semiconductor devices. More particularly, this invention relates to a novel and improved cell structure and improved process for fabricating a trench MOSFET with improved metal schemes for copper bonding.

2. The Prior Arts

Please refer to FIG. 1 for a Cu bonding compatible bond pad structure of prior art (U.S. Patent application publication No. 20080006951). The disclosed structure includes a buffering structure comprising exposed electrode metal regions 118 of electrode metal layer 114 formed over a TiNi barrier metal layer 112 and non-conductive passivation regions 120 having same material as passivation layer 116. As illustrated, while bonding Cu bonding wire 122, some of the passivation regions 120 were pushed into the electrode metal layer 114 to provide a buffer function to keep Cu bonding wire 122 away from barrier metal layer 112 and the semiconductor device whereunder.

By employing non-conductive passivation material as buffer layer, the structure of prior art shown in FIG. 1 minimized bonding damage on semiconductor device, however, comparing to its advantage, the disadvantages brought by this passivation structure are more significant to a certain extent. First of all, more cost are needed due to the requirement of additional passivation layer deposition, masking and etching; Second, wire bonding resistance is increased because that some Cu bonding area is occupied by the non-conductive passivation layer; Third, bad wire bonding adhesion issue is introduced due to Cu wire contacting with passivation layer in some area. Therefore, it is necessary to provide an improved metal bonding structure with lower cost, lower power consumptions, as well as steady performance.

Please refer to FIGS. 2 to 4 for MOSFETs structures of another prior art (U.S. Pat. No. 6,888,196). In FIG. 2, the trench MOSFET is formed on a heavily doped substrate 200 of a first semiconductor doping type, e.g., N+ dopant, on which an epitaxial layer 202 doped with the same first semiconductor doping type is grown. Inside epitaxial layer 202, a plurality of trench gates 210 are formed over a gate oxide layer 208. Between each trench, there is a body region 212 of a second semiconductor doping type, e.g., P dopant, introduced by Ion Implantation, and N+ source regions 214 near the top surface of P-body area. Said source regions and body regions are connected to source metal 220 via metal plug 216 in source-body contact trench through a layer of oxide interlayer 218. Around the bottom of each metal plug 216, an area of heavily P+ doped 206 is formed to reduce the resistance between source and body region. Metal layer 220 serving as source metal is deposited on the front surface of whole device while metal layer 222 serving as drain metal deposited on the rear side of substrate 200.

As mentioned above, the metal plug 216, e.g., W plug, filled in source-body contact trench connects directly with the front source metal through the contact trench open area in oxide interlayer film 218, in other words, no buffer layer is available while bonding Cu wire upon source metal layer. Therefore, thick front source metal is required to minimize the bonding damage to semiconductor device, leading to extra cost and metal etching complication.

On the other hand, the P+ area 206 underneath trench source-body contact bottom is formed by BF2 Ion Implantation before source-body contact trench's filled with contact material. As the sidewalls of source-body contact trench is perpendicular to the front surface of epitaxial layer, said P+ area can be implanted only around the bottom of source-body contact trench no matter with or without oxide film BF2 Ion Implantation, resulting in a high resistance Rp underneath N+ source and between channel and P+ area. As is known to all, a parasitic N+/PIN will be turned on if Iav*Rp>0.7V where Iav is avalanche current originated from the trench bottom. Therefore, the conventional vertical source contact shown in FIG. 2 also has a poor avalanche capability which significantly affects the performance of whole device.

Another MOSFETs structure with P+ region formed by BF2 Ion Implantation through an oxide film deposited on the contact trench was disclosed in that application, as shown in FIG. 3. The structure here is almost the same as structure in FIG. 2 except for the slope source-body contact trench. However, even if the slope contact trench is helpful to enlarge the P+ area under trench source-body contact during BF2 Ion Implantation, it is still not enough to resolve the high Rp problem as the P+ area is also formed only around the bottom of source-body contact trench. Meanwhile, a similar structure with P+ region formed on both bottom and sidewall of source-body contact trench by BF2 Ion Implantation without through the oxide film of prior art is given in FIG. 4. As there is no oxide film, the P+ area is apparently enlarged to be formed on the sidewall of source-body contact trench besides the bottom, resolving the high Rp issue discussed above. However, anther problem is thus introduced, which is that the N+ concentration on contact trench sidewalls will be reduced as a result of compensation by BF2 Ion Implantation due to no oxide film as stopper, causing high source contact resistance.

At the same time, structures illustrated in FIG. 3 and FIG. 4 both required thick front metal to minimize the bonding damage to semiconductor device due to the lack of buffer layer.

Accordingly, it would be desirable to provide a trench MOSFET cell with improved metal schemes and improved source contact structure to avoid those problems mentioned above.

SUMMARY OF THE INVENTION

It is therefore an object of the present invention to provide new and improved trench MOSFET cell and manufacture process to minimize the Cu wire bonding damage to semiconductor device without additional cost.

One aspect of the present invention is that, a W layer with a resistance reduction layer composed of Ti or Ti/N whereon underneath a front metal of source and gate is provided as buffer layer for reducing Cu wire bonding damage. The difference between the prior art of U.S. Pat. No. 6,888,196 and the present invention is that, in the prior art the W layer is totally removed from surface of oxide interlayer film after W deposition to fill the source-body contact trench while in the present invention it is selectively removed, in other words, the W layer is only kept on the oxide interlayer surface of the areas underneath source and gate metal to serve as buffer layer when bonding Cu wire upon source and gate metal, therefore, no additional cost is needed. And, comparing to structure in FIG. 1, the high wire bonding resistance and wire bonding adhesion issue are both resolved due to Cu bonding wire directly bonded to front source and gate metal layer. Additionally, contact resistance between buffer layer and front metal of source and gate are further reduced by employing the resistance reduction layer composed of Ti or Ti/N sandwiched therebetween.

Another aspect of the present invention is that, in some preferred embodiment, an improved source-body contact structure is proposed, which has vertical contact trench sidewalls within oxide interlayer and N+ source regions, and has slope contact trench sidewalls within P-body region. To be detailed, the contact trench sidewalls are substantially vertical (90+/−5 degree) within oxide interlayer and N+ source regions, and the taper angle is less than 85 degree respect to top surface of epitaxial layer within P-body region. By employing this structure, the P+ area can be enlarged to wrap the bottom and the slope sidewalls of source-body contact trench in P-body region, which resolves the high Rp problem and enhances the avalanche capability. On the other hand, there will be no BF2 Ion Implantation into the sidewalls of N+ source regions because the sidewall are substantially vertical, avoiding the N+ concentration reduction issue occurs in FIG. 4, thus preventing the increasing of source contact resistance from happening.

Another aspect of the present invention is that, in some preferred embodiment, the conventional poly gate within gate trench is replaced by a terrace gate, which will provide additional poly over silicon mesa area to further reduce gate resistance Rg, and what is the most important is that, a self-aligned source contact is implemented by employing the terrace gate structure, therefore resolved avalanche current Iav and Rds non-uniform distribution issue resulted from misalignment between contact and trench.

Briefly, in a preferred embodiment, as shown in FIG. 5, the present invention disclosed a trench MOSFET cell comprising: a heavily doped substrate of a first semiconductor doping type, e.g., N dopant, with a layer of Ti/Ni/Ag on the rear side serving as drain metal; a lighter doped epitaxial layer of a first semiconductor doping type grown on said substrate; a plurality of trenches etched into said epitaxial layer as gate trenches; a gate oxide layer along the inner surface of said gate trenches; doped poly filled within said gate trenches to form trench gates; a thin oxide layer formed onto trench gate and the top surface of epitaxial layer; body regions of a second semiconductor doping type, e.g., P dopant, extending between every two trench gates; source regions above the top surface of P-body regions; an oxide interlayer film onto front surface of a thin oxide layer; a vertical source-body contact trench penetrating through said oxide interlayer, said source regions and into said body regions with vertical sidewalls; P+ area wrapping the bottom of source-body contact trench to reduce the resistance between source and body; W metal deposited over a layer of Ti/TiN or Co/TiN to serve as contact metal plug into source-body contact trench and also serve as buffer layer covering the surface of the oxide interlayer; metal Al alloys or Copper over Ti or Ti/TiN layer deposited onto a resistance reduction layer composed of Ti or Ti/N to serve as source and gate metal with Cu wires bonded whereon.

Briefly, in another preferred embodiment, as shown in FIG. 6, the present invention disclosed a trench MOSFET cell same as FIG. 5 except the slope source-body contact trench.

Briefly, in another preferred embodiment, as shown in FIG. 7, the present invention disclosed a trench MOSFET cell same as FIG. 5 except that the source-body contact trench is vertical in source region and slope in body region Briefly, in another preferred embodiment, as shown in FIG. 9, the present invention disclosed a trench MOSFET cell comprising: a heavily doped substrate of a first semiconductor doping type, e.g., N dopant, with a layer of Ti/Ni/Ag on the rear side serving as drain metal; a lighter doped epitaxial layer of a first semiconductor doping type grown on said substrate; a plurality of trenches etched into said epitaxial layer as gate trenches and especially, trench for gate connection is wider than others; a gate oxide layer along the inner surface of said gate trenches; doped poly filled not within gate trenches but to form terrace gates above gate oxide layer; a thin oxide layer formed onto the top surface of said epitaxial layer; body regions of a second semiconductor doping type, e.g., P dopant, extending between every two terrace gates; source regions near the top surface of P-body regions; oxide interlayer layer deposited above the thin oxide layer and covering the sidewalls and surface of terrace gate to form self-aligned contact structure; source-body contact trench with a smaller width in Si portion than in oxide interlayer portion; gate contact trench opened through oxide interlayer and into terrace gate for gate connection; P+ area wrapping the source-body contact trench bottom and the sidewalls inside P-body portion; W metal deposited over a layer of Ti/TiN or Co/TiN to serve as contact metal plug into source-body contact and gate contact trench, and also serve as buffer layer covering the surface of oxide interlayer; metal Al alloys or copper over Ti or Ti/TiN deposited onto a resistance reduction layer composed of Ti or Ti/N to be patterned as source and gate metal with Cu wires bonded whereon.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
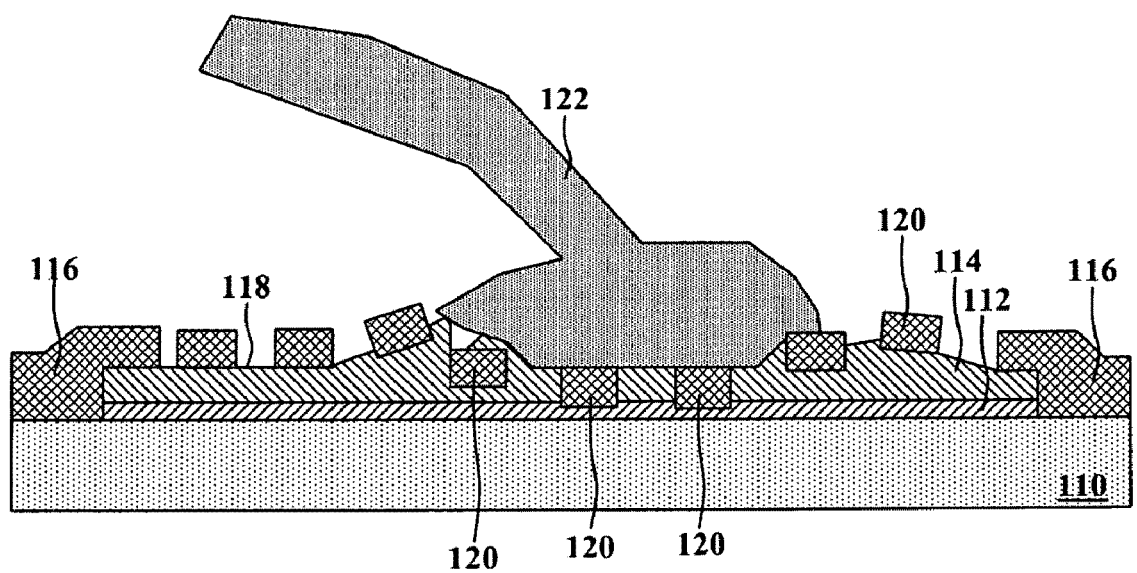
FIG. 1 is a side cross-sectional view of the buffering structure of prior art.
Figure 2:
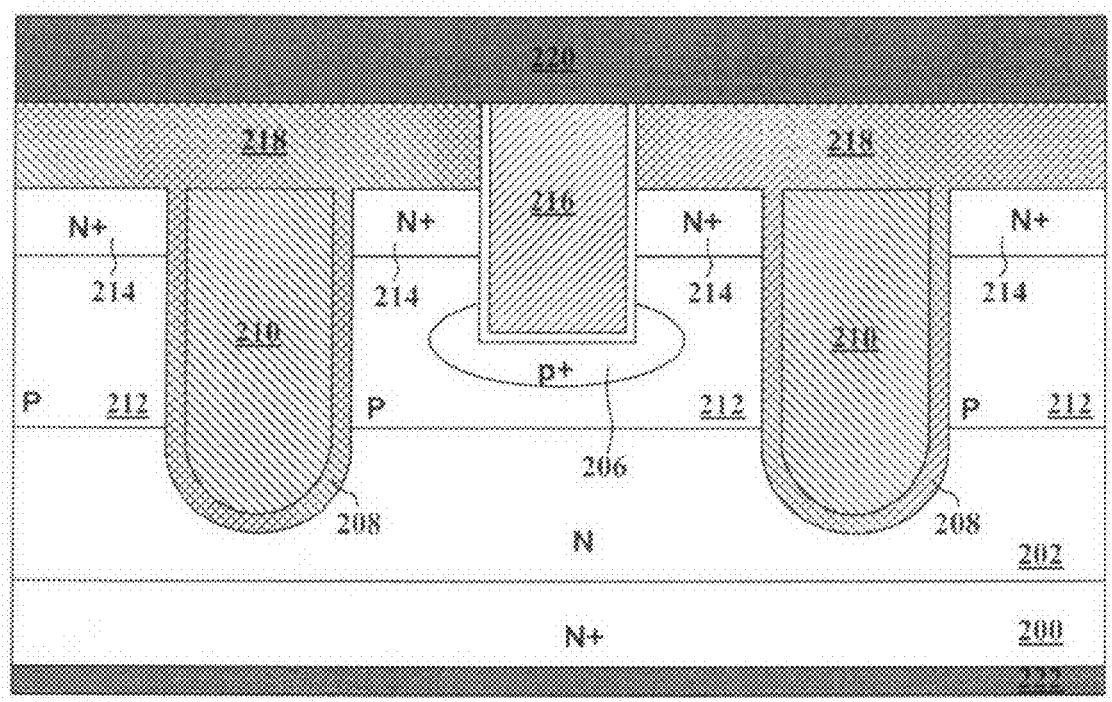
FIG. 2 is a side cross-sectional view of a trench MOSFET cell of prior art.
Figure 3:
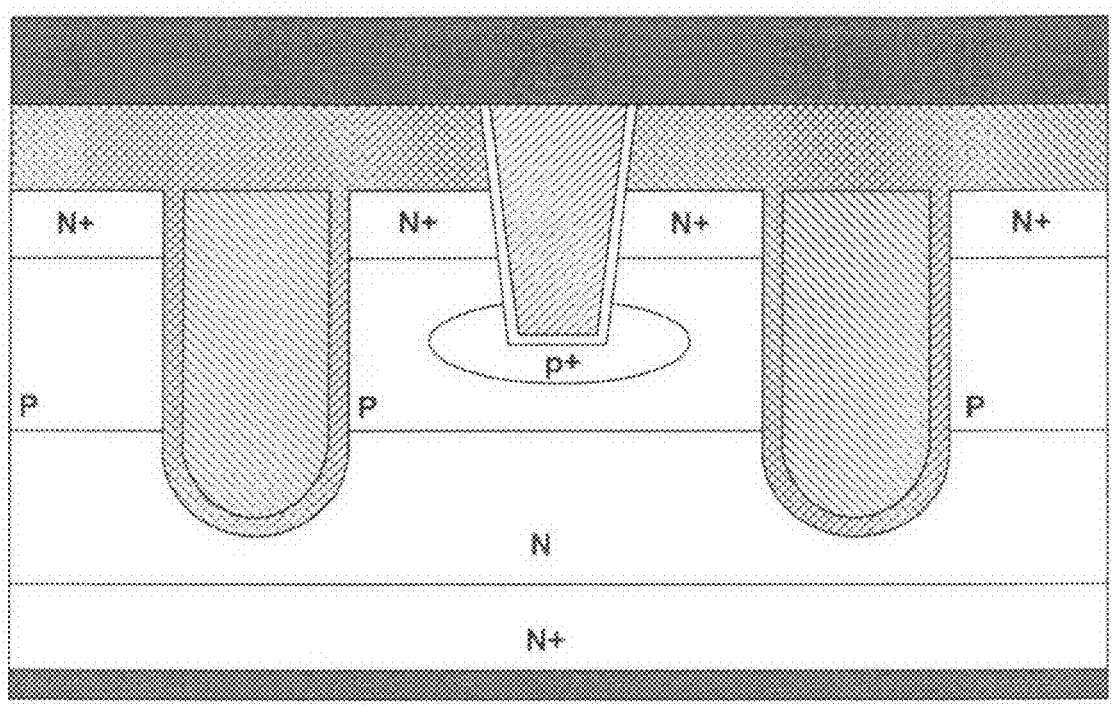
FIG. 3 is a side cross-sectional view of another trench MOSFET cell of prior art.
Figure 4:
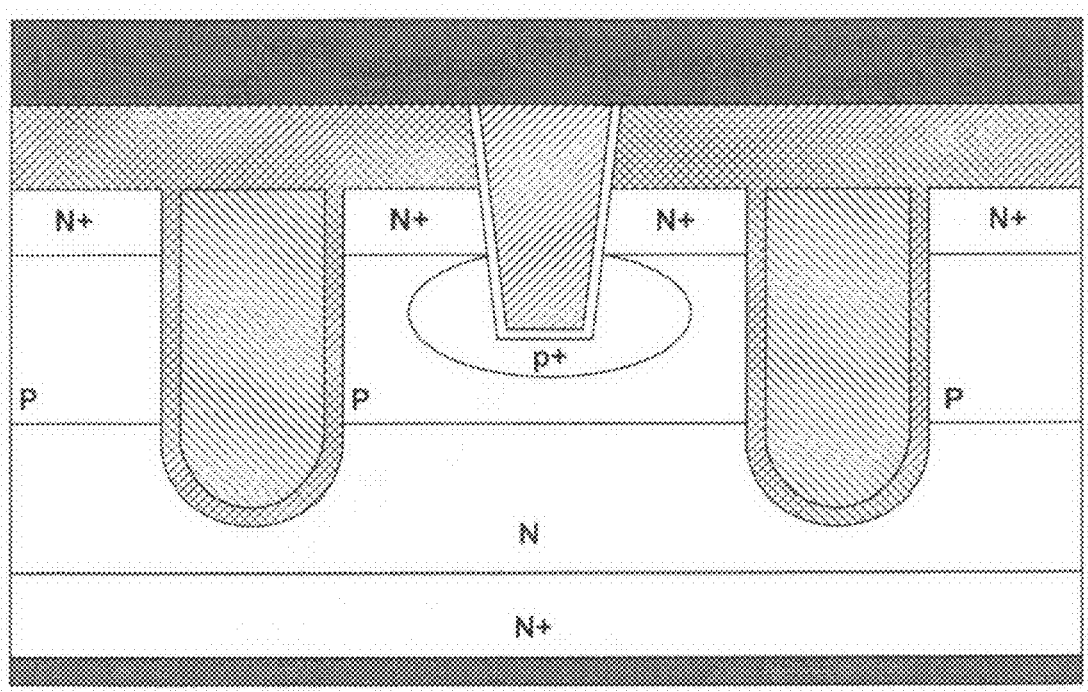
FIG. 4 is a side cross-sectional view of another trench MOSFET cell of prior art.
Figure 5:
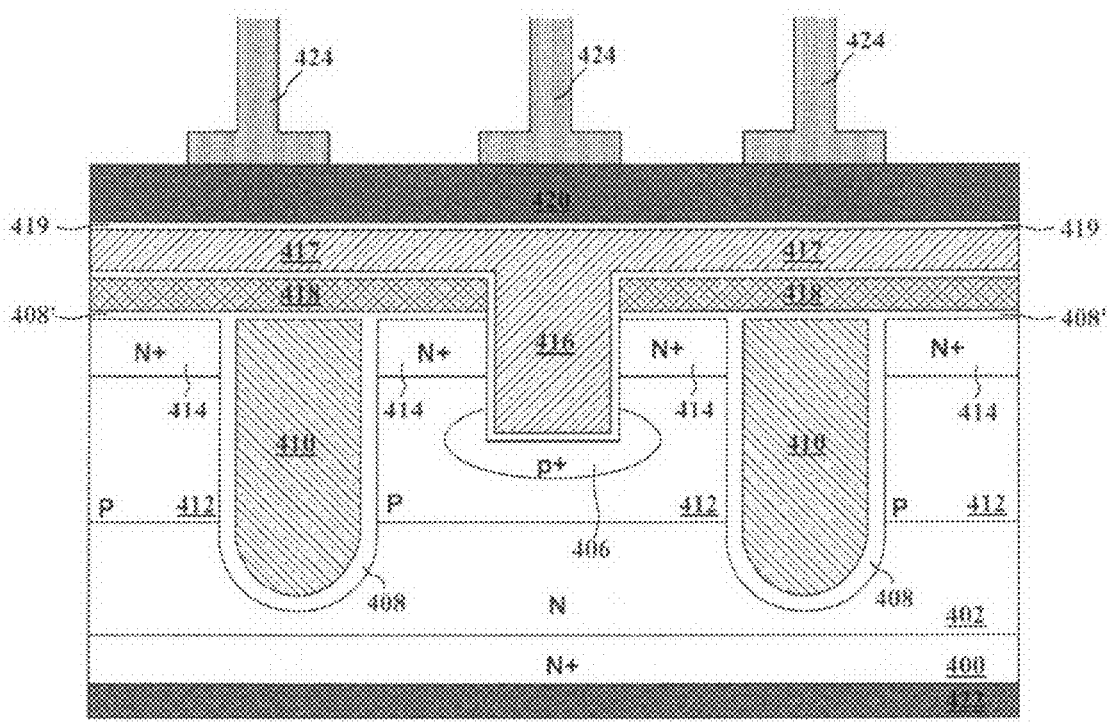
FIG. 5 is a side cross-sectional view of a preferred embodiment in accordance with the present invention.

Please refer to FIG. 5 for a preferred embodiment of the present invention. The shown trench MOSFET cell is formed on an N+ substrate 400 coated with back metal Ti/Ni/Ag 422 on rear side as drain. Onto said substrate 400, grown an N epitaxial layer 402, and a plurality of trenches were etched wherein. To fill these trenches, doped poly was deposited into trenches above gate oxide layer 408 to form trench gates 410. P-body regions 412 are extending between trenches gates 410 with a layer of source regions 414 above the top surface of P-body regions 412. Source-body contact trench is etched through an oxide interlayer 418, a thin oxide layer 408' and N+ source region 414, and into P-body region 412. Especially, the sidewalls of source-body contact trench are perpendicular to the front surface of epitaxial layer. To fill source-body contact trench, Ti/TiN/W or Co/TiN/W is deposited not only within contact trench as metal plug 416 but also cover the surface of oxide interlayer 418 to act as buffer layer 417 for Cu wire bonding. Underneath the metal plug 416, a heavily P+ doped area 406 is formed wrapping its bottom to reduce the resistance between source and body. Above the buffer layer 417, a source metal 420 either Al alloys or Copper is deposited over a resistance reduction layer 419 composed of a low resistance metal layer such as a Ti or Ti/TiN layer for reducing contact resistance between the source metal 420 and the buffer layer 417, electrically connected to source region and body region with Cu bonding wire 424 bonded whereon while drain metal Ti/Ni/Ag 422 is deposited on the rear side of the substrate.

Figure 6:
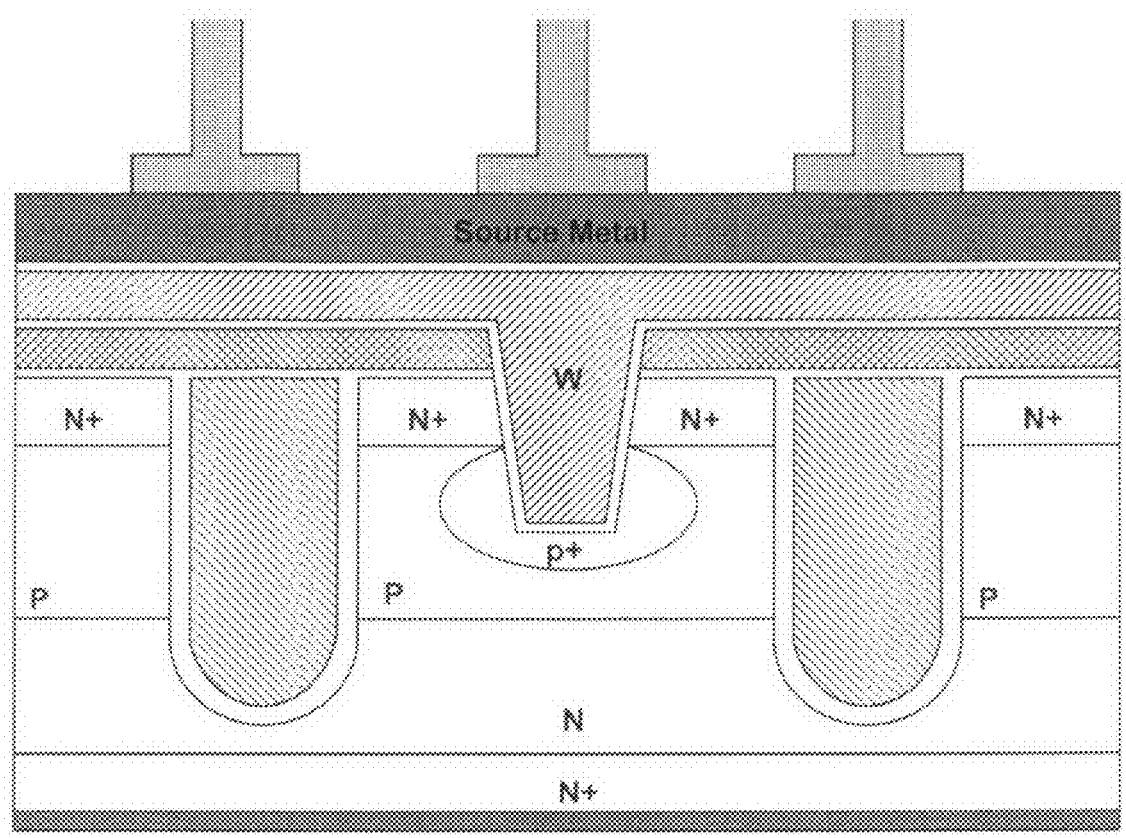
FIG. 6 is a side cross-sectional view of another preferred embodiment in accordance with the present invention.

FIG. 6 shows another preferred embodiment of the present invention. Comparing to FIG. 5, the structure in FIG. 6 has a different source-body contact structure with slope sidewalls to partially enlarge the P+ area along source-body contact trenches.

Figure 7:
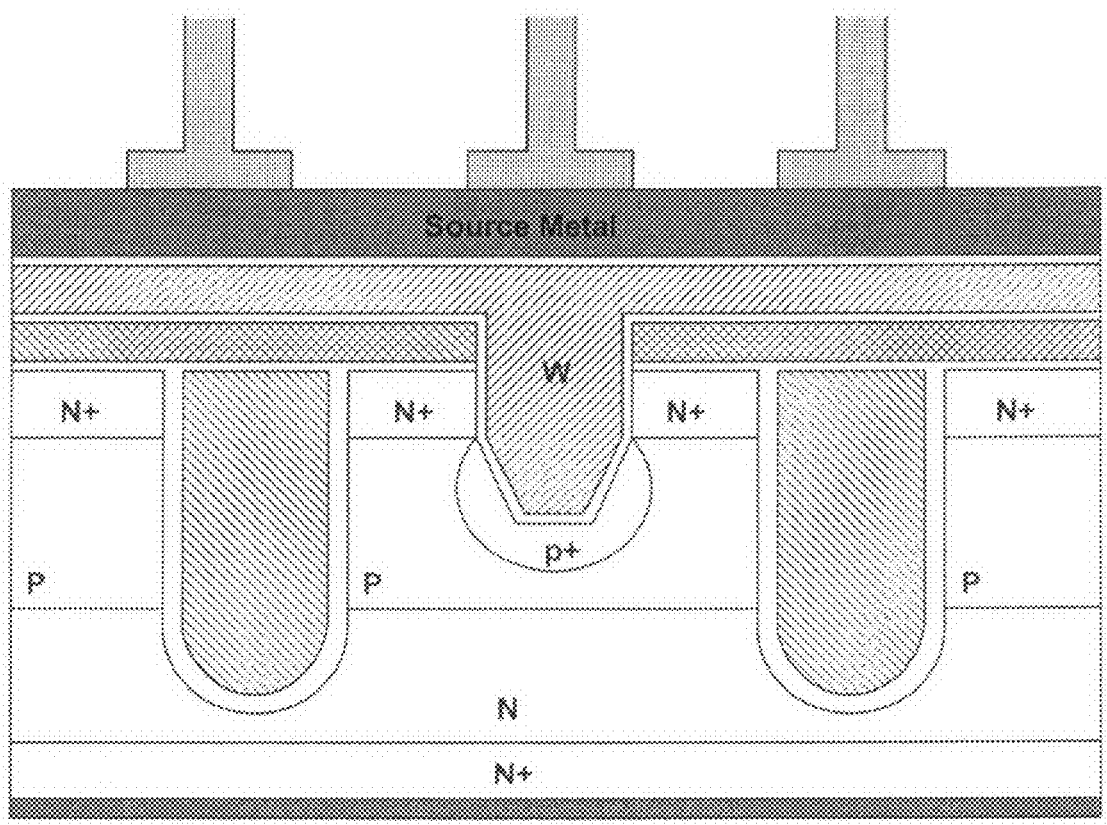
FIG. 7 is a side cross-sectional view of another preferred embodiment in accordance with the present invention.

FIG. 7 shows another preferred embodiment of the present invention. Comparing to FIG. 5, the structure in FIG. 7 has a different source-body contact structure. Especially, the sidewalls of source-body contact trenches are perpendicular to the front surface of epitaxial layer within the oxide interlayer and N+ source region while is oblique within P-body region with a taper angle less than 85 degree respective to top surface.

Figure 8:
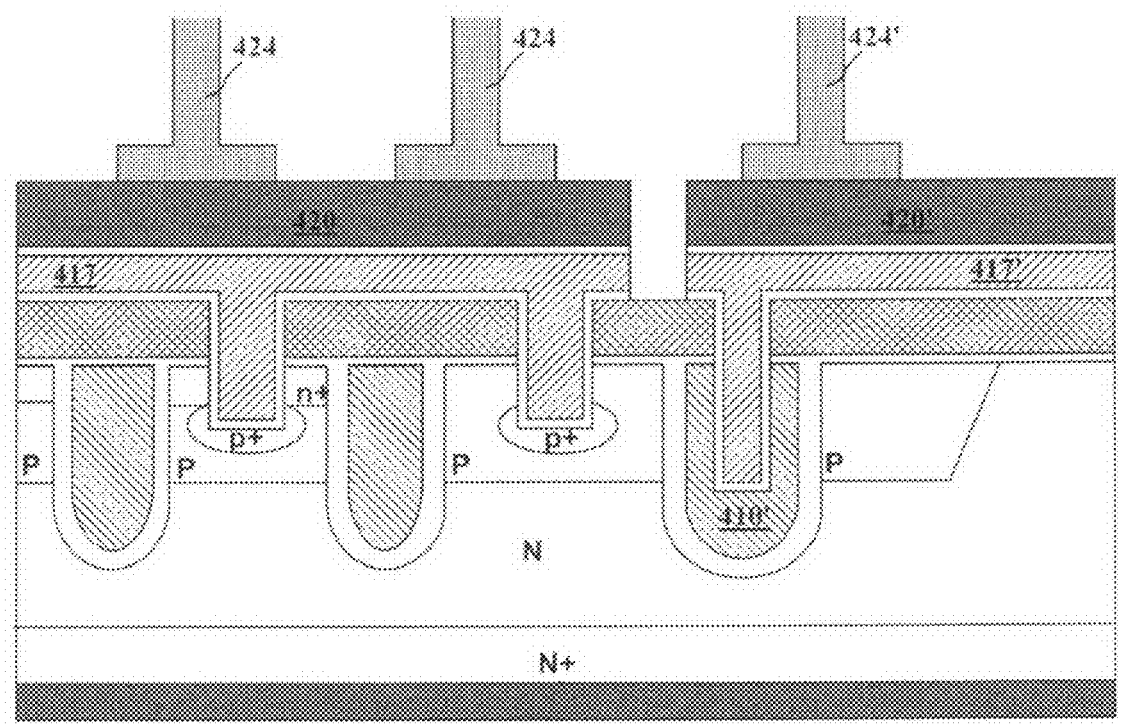
FIG. 8 is a side cross-sectional view of embodiment in FIG. 5 with trench gate metal area.

FIG. 8 shows structure in FIG. 5 with trench gate metal area. At least a wider trench gate 410' is formed inside epitaxial layer for gate connection wherein a gate contact trench is etched and filled with Ti/TiN/W or Co/TiN/W to connect trench gate to gate metal. Buffer layer and front metal are patterned to form source metal 420 with Cu bonding wire 424 over buffer layer 417 and gate metal 420' with Cu bonding wire 424' over buffer layer 417'.

Figure 9:
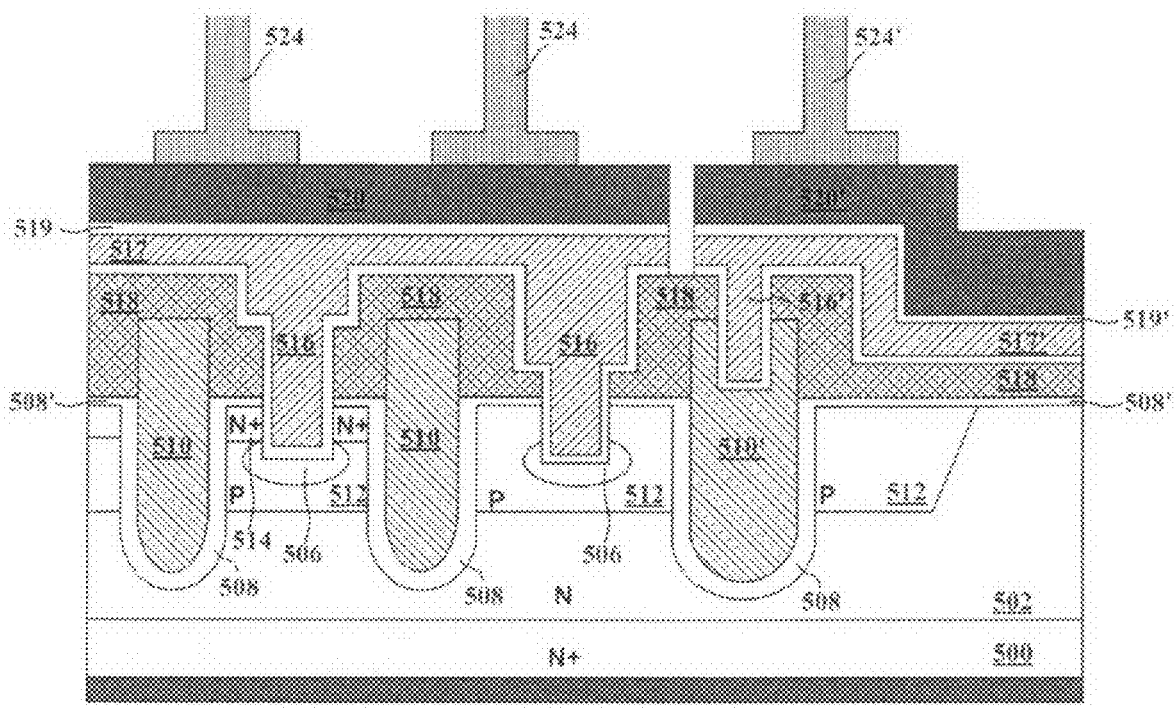
FIG. 9 is a side cross-sectional view of another preferred embodiment with trench gate metal area in accordance with the present invention.

FIG. 9 shows another preferred embodiment of the present invention with trench gate metal area. The disclosed trench MOSFET cell formed on an N+ substrate 500 coated with back metal Ti/Ni/Ag on rear side as drain. Onto said substrate 500, grown an N epitaxial layer 502, and a plurality of trenches were etched wherein, especially, a trench for gate connection is wider than trenches under source metal region. To fill these trenches, doped poly was deposited not within those trenches but to form terrace gate 510 and 510' above gate oxide layer 508. P-body regions 512 are extending between said trenches with a layer of source regions 514 above the top surface of said P-body region between trenches 510. Self-aligned source-body contact structure is implemented through oxide interlayer 518, a thin oxide layer 508' and into epitaxial layer while gate contact trench is etched through the oxide interlayer 518 and into terrace gate 510'. To be detailed, the width of source-body contact in upper oxide interlayer portion is bigger than that within epitaxial layer and underneath said source-body contact, P+ area 506 is implanted to reduce the resistance between source and body. Metal W is deposited over a layer of Ti/TiN or Co/TiN into source-body contact trench and gate contact trench to form source-body contact 516 and gate contact 516' while covering the surface of oxide interlayer 518 to serve as buffer layer 517 and 517' for Cu wire bonding. Source metal 520 bonded with Cu bonding wire 524 and gate metal 520' bonded with Cu bonding wire 524' are formed over resistance reduction layer 519 and 519' composed of a low resistance metal layer such as a Ti or Ti/TiN layer for reducing contact resistance between source metal 520 and buffer layer 517, and gate metal 520' and buffer layer 517', respectively.

Figure 10A:
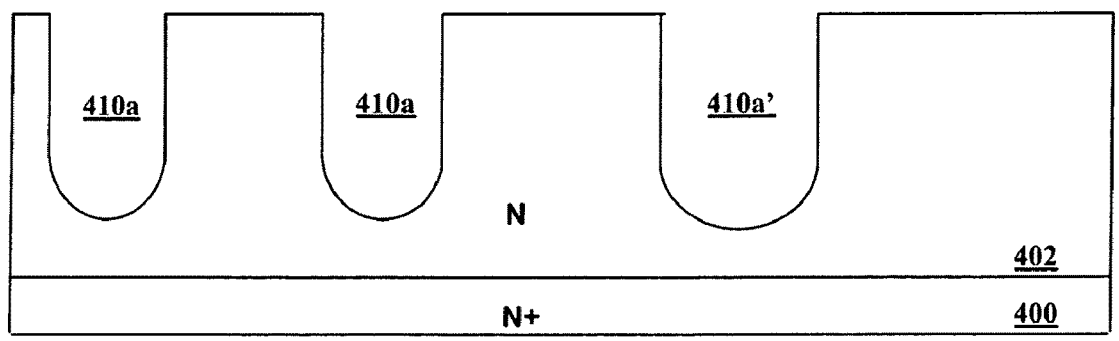
FIG. 10A to 10E are a serial of side cross sectional views for showing the processing steps for fabricating trench MOSFET cell in FIG. 8.
Figure 10B:
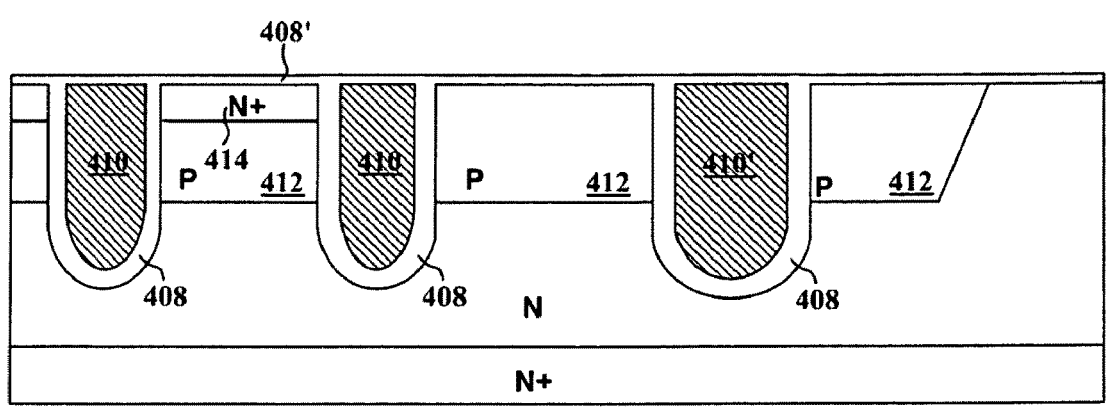
Figure 10C:
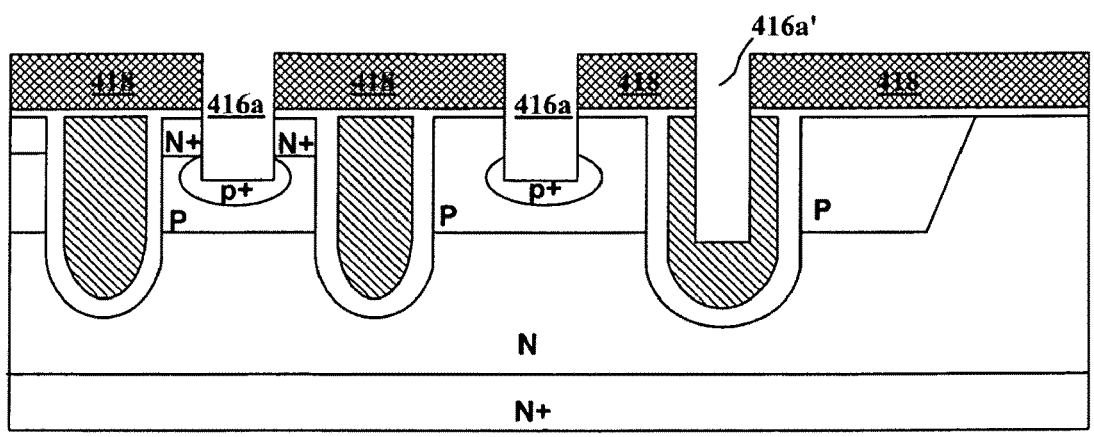
Figure 10D:
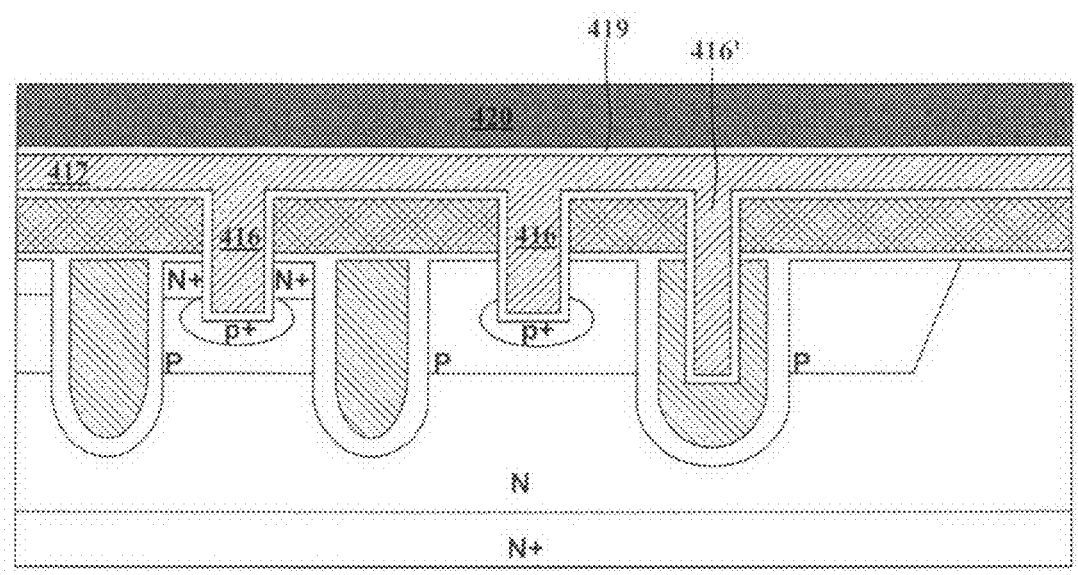
Figure 10E:
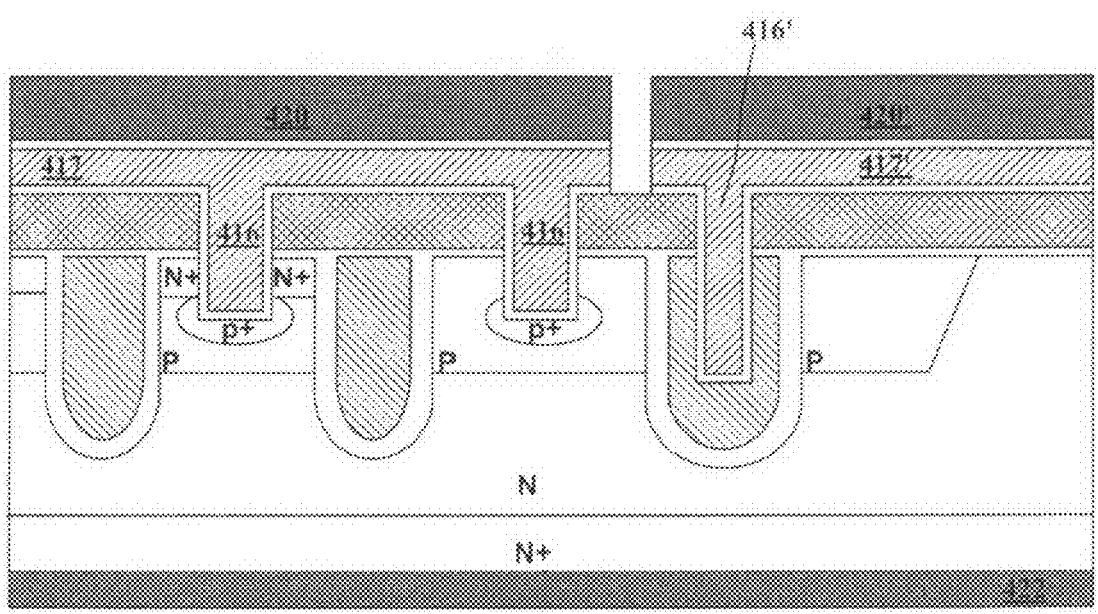

FIGS. 10A to 10E show a series of exemplary steps that are performed to form the inventive trench MOSFET of the present invention shown in FIG. 8. In FIG. 10A, an N-doped epitaxial layer 402 is grown on an N+ substrate 400, then, a trench mask (not shown) is applied, which is then conventionally exposed and patterned to leave mask portions. The patterned mask portions define the gate trenches 410a and at least a wider gate trench 410a' for gate connection, which are dry silicon etched through mask opening to a certain depth. In FIG. 10B, a sacrificial oxide (not shown) is grown and then removed to eliminate the plasma damage may introduced during trenches etching process. After the trench mask removal, a gate oxide 408 is formed on the front surface of epitaxial layer and the inner surface of gate trenches 410a and 410a'. Next, all gate trenches 410a and 410a' are filled with doped poly to form trench gates 410 and at least a wider trench gate 410' for gate connection. Then, the filling-in conductive material such as doped poly is etched back or CMP (Chemical Mechanical Polishing) to expose the portion of gate oxide layer that extends over the surface of epitaxial layer. Next, by employing a P-body mask, an Ion Implantation is applied to form P-body regions 412, followed by a P-body diffusion step for P-body region drive in. After removing the P-body mask, another Ion Implantation is applied to form N+ source regions 414 using a source mask followed by an n+ diffusion step for source regions drive in. Then, a thin oxide layer 408' is formed over whole top surface. In FIG. 10C, the process continues with the deposition of oxide interlayer 418 over thin oxide layer 408'. Then, a contact mask (not shown) is applied to carry out the source-body contact etch to open the source-body contact trench 416a and gate contact etch to open gate contact trench 416a' by successive dry oxide etching and dry silicon etching. Next, the BF2 Ion Implantation is applied over entire surface to form the P+ area wrapping the bottom of source-body contact trench within P-body region to further reduce resistance betweens source and body. In FIG. 10D, after the deposition of Ti/TiN or Co/TiN layer, source-body contact trench 416a and gate contact trench 416a' are filled with W metal to form source-body contact 416 and gate contact 416'. At the same time, the deposited W metal formed a buffer layer 417 for Cu wire bonding. After that, Al Alloys or copper metal layer is deposited over a resistance reduction layer 419 composed of a low resistance metal layer such as a Ti or Ti/TiN layer to serve as front metal 420. Last, in FIG. 10E, metal mask is deposited to pattern the metal layer and buffer layer into source portion and gate portion by dry metal etching, as illustrated, after removing the metal material, front metal is patterned into source metal 420 and gate metal 420' while buffer layer is patterned into source portion 417 and gate portion 417'. Drain metal 422 Ti/Ni/Ag 422 is then deposited on rear surface after backside grinding.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A vertical semiconductor power MOS device with a buffer metal layer for copper bonding comprising a plurality of semiconductor power cells with each cell comprising a plurality of trench gates surrounded by a plurality of source regions above a plurality of body regions above a drain region disposed on a bottom surface of a substrate, wherein said trench MOSFET further comprising:

a substrate of a first type conductivity;
an epitaxial layer of said first type conductivity over said substrate, having a lower doping concentration than said substrate;
a plurality of trenches extending into said epitaxial layer, surrounded by a plurality of source regions of said type conductivity above said body regions of the second type conductivity;
a first insulating layer lining said trenches as gate dielectric;
a doped polysilicon of the first type conductivity as gate regions overlying said first insulating layer;
a second insulating layer disposed over said epitaxial layer as an oxide interlayer;
a plurality of source-body contact trenches penetrating through said second insulating layer and said source regions, and into said body regions;
a first front metal layer of Ti/TiN/W or Co/Ti/W comprising a Tungsten (W) layer deposited over a Ti/TiN or Co/TiN barrier layer, covering said second insulating layer and filling into said source-body trenches as trench metal plug connected to said source and body regions, and also as said buffer metal layer for minimizing copper wire bonding damage to semiconductor device;
a second front metal disposed on front surface of device as source metal for Cu wire bonding;
a backside metal disposed on backside of said substrate as drain metal.

2. The trench MOSFET of claim 1, wherein the angle between said source-body contact trench sidewalls and said top surface is 90+/−5 degree within said source and said body regions.

3. The trench MOSFET of claim 1, wherein the angle between said source-body contact trench sidewalls and top surface is less than 85 degree within said source and body regions.

4. The trench MOSFET of claim 1, wherein the angle between said source-body contact trench sidewalls and said top surface is 90+/−5 degree within said source regions and is less than 85 degree within said body regions.

5. The trench MOSFET of claim 1 further comprises a resistance reduction layer composed of a low resistance metal layer such as a Ti or Ti/TiN layer underneath said second front metal is deposited on top of said first front metal.

6. The trench MOSFET of claim 1, wherein said second metal is Al alloys or Cu.

7. A method for manufacturing a trench MOSFET with improved metal schemes comprising the steps of:

growing an epitaxial layer upon a heavily N doped substrate, wherein said epitaxial layer is doped with a first type dopant, e.g., N dopant;
forming a trench mask with open and closed areas on the surface of said epitaxial layer;
removing semiconductor material from exposed areas of said trench mask to form a plurality of gate trenches;
growing a sacrificial oxide layer onto the surface of said trenches to remove the plasma damage introduced during opening said trenches;
removing said sacrificial oxide and said trench mask;
forming a first insulating layer on the surface of said epitaxial layer and along the inner surface of said gate trenches as gate oxide;
depositing doped poly or combination of doped poly onto said gate oxide and into said gate trenches;
forming a body mask and implanting said epitaxial layer with a second type dopant to from P-body regions;
removing said body mask and forming a source mask;
implanting whole device with a first type dopant to form source regions;
forming a second insulating layer onto whole surface;
forming a contact mask on the surface of said second insulating layer and removing the insulating material and semiconductor material;
implanting BF2 ion to form P+ area wrapping sidewalls and bottom of source-body contact trench within P-body region;
depositing Ti/TiN/W or Co/TiN/W consequently into source-body contact trenches and on the front surface;
depositing a layer of Al alloys on the front and rear side of device, respectively.

8. The method of claim 7, wherein forming said gate trenches comprises etching said epitaxial layer according to the open areas of said trench mask by dry silicon etching.

9. The method of claim 7, wherein filling said doped poly comprises making doped poly mesa over the first insulating layer to form terrace gate.

10. The method of claim 7, wherein forming said P-body regions comprises a step of diffusion to achieve a certain depth after P-body implantation step.

11. The method of claim 7, wherein forming said source regions comprises a step of diffusion to achieve a certain depth after n+ Ion Implantation step.

12. The method of claim 7, wherein forming said source-body contact trench comprises etching through said N+ source regions and into said P-body regions by dry silicon etching according to the exposed areas of said contact mask.

13. The method of claim 7, wherein implanting BF2 ion to form P+ area comprises implanting BF2 ion above source-body contact trench as well as above the second insulating layer.

* * * * *